United States Patent
Falk

(10) Patent No.: US 9,018,999 B2
(45) Date of Patent: Apr. 28, 2015

(54) MULTI-POINT ANALOG TO SINGLE-LINE INPUT FOR A PLC SYSTEM

(71) Applicant: M&R Printing Equipment, Inc., Glen Ellyn, IL (US)

(72) Inventor: Keith R. Falk, Cary, IL (US)

(73) Assignee: M&R Printing Equipment, Inc., Glen Ellyn, IL (US)

( * ) Notice: Subject to any disclaimer, the term of this patent is extended or adjusted under 35 U.S.C. 154(b) by 0 days.

(21) Appl. No.: 13/921,357

(22) Filed: Jun. 19, 2013

(65) Prior Publication Data

US 2013/0342257 A1 Dec. 26, 2013

Related U.S. Application Data

(60) Provisional application No. 61/662,529, filed on Jun. 21, 2012.

(51) Int. Cl.
*H03K 3/00* (2006.01)
*H03K 5/13* (2014.01)

(52) U.S. Cl.
CPC ...................... *H03K 5/131* (2013.01)

(58) Field of Classification Search
CPC ....................................................... H03K 5/131
USPC ................. 327/291, 298, 299; 326/39, 41, 47
See application file for complete search history.

(56) References Cited

U.S. PATENT DOCUMENTS

| | | | | |
|---|---|---|---|---|
| 5,528,169 | A * | 6/1996 | New ................................ | 326/40 |
| 7,227,398 | B2 * | 6/2007 | Rosen ............................ | 327/292 |
| 7,583,124 | B2 * | 9/2009 | Kuo et al. ...................... | 327/276 |

* cited by examiner

*Primary Examiner* — John Poos
(74) *Attorney, Agent, or Firm* — Nixon Peabody LLP

(57) ABSTRACT

A hardware/PLC logic combination which enables measurement of a plurality of analog voltage points (e.g., multiples of 8 points) on a single high speed PLC input without separate synchronization inputs or outputs. This is accomplished through the use of a multiplexer circuit [clock, binary counter, analog multiplexer, voltage to frequency converter], and a high speed counter function at the PLC. Synchronization between the PLC and circuit is through the detection of a fixed voltage on channel "one" of the circuit, which is set well above the typical range (e.g., 0-10V) of the remaining analog inputs.

20 Claims, 14 Drawing Sheets

MULTI-POINT ANALOG TO SINGLE-LINE INPUT FOR A PLC SYSTEM

CROSS-REFERENCE TO RELATED APPLICATIONS

The present invention claims the benefit of U.S. Provisional Patent Application Ser. No. 61/662,529, filed Jun. 21, 2012, the contents of which are incorporated herein by reference.

FEDERALLY SPONSORED RESEARCH OR DEVELOPMENT

N/A

FIELD OF THE INVENTION

The present invention relates to a system and method for inputting multiple analog channels to a single PLC input; and more particularly to a system and method having a multiplexor for sequentially selecting and inputting multiple analog channels to a single PLC input without any additional synchronization inputs or outputs.

BACKGROUND OF THE INVENTION

When designing control systems, there are times when it is not cost effective to use a Programmable Logic Controller [PLC] with high physical input/output [I/O] and special extension modules for analog sensing. Such is the case with low profit margin, low cost, low production commercial applications.

Certain prior systems could be expanded to provide a plurality of channels to a PLC. However, such systems required a numerical input in addition to the channel input.

The present system provides a low cost way to expand a single high speed input of a low cost, low physical I/O PLC into multiple 0-10 vdc high resolution analog/low speed digital sensing points. The system utilizes no additional inputs or outputs for synchronization or read/write operations—just a single wire connection will expand one high speed PLC input to a plurality (e.g., 8, 16, etc.) of analog/digital channels, freeing up the remaining PLC inputs for other uses.

SUMMARY OF THE INVENTION

The present invention provides a multiplexer system for connecting a plurality of devices to a single input of a PLC.

In accordance with one embodiment of the invention, a multiple channel system for a single input of a controller (such as a programmable logic controller or PLC) is provided. The system comprises a first multiplexer having a plurality of inputs and an output, a binary counter circuit coupled to the first multiplexer and, a controller having a first input coupled to the output of the first multiplexer. The system is configured so that the first input selectively receives data from the plurality of inputs to the first multiplexer.

The system can further include a clock coupled to the binary counter circuit. The system can also include a voltage to frequency converter coupled to the multiplexer.

Each input of the first plurality of inputs of the first multiplexer can be coupled to a device providing an analog voltage signal. One of the plurality of inputs of the first multiplexer can be coupled to a reference voltage to synchronize the system.

The system can further comprise a second multiplexer having a plurality of inputs and an output. The output of the second multiplexer are also coupled to the first input of the controller to allow the first input to selectively receive data from the plurality of inputs to the second multiplexer. In this manner the system can be expanded to include additional inputs for the first input of the controller. The binary counter can be coupled to the second multiplexer.

The system can comprise circuitry for passing digital data to the controller. The circuitry for passing digital data to the controller can include a plurality of pull up resisters where each pull-up resister is coupled to one of the plurality of inputs to the first multiplexer.

In accordance with another embodiment of the invention, a multiple channel system for a single input of a PLC is provided. The multiple channel system comprises a first multiplexer circuit having a first plurality of inputs (i.e., channels). The inputs can be connected to a variety of different devices providing data to the PLC. A voltage to frequency converter circuit is coupled to the multiplexer circuit. The voltage to frequency converter circuit is configured so that the maximum input voltage applied to the multiplexer circuit produces a frequency that is matched to the maximum input speed of the single input of the PLC. A binary counter circuit is also coupled to the multiplexer circuit, and a clock circuit is coupled to the binary counter circuit. Collectively, the clock circuit and the binary counter are configured to sequence the multiplexer circuit through the plurality of inputs. The system includes a single output coupled to the voltage to frequency converter circuit for connection to a single input of the PLC. The single output provides data from the plurality of inputs (connected to various devices) to the single input of the PLC. Other like systems can be used to provide multiple data inputs to other inputs of the PLC.

The multiplexer circuit, as well as all or some of the other circuits in the system, can be on or part of one or more semiconductor chips. All of the circuits and chips can be placed on a single board.

The system is configured so that one of the plurality of inputs of the multiplexer circuit is connected to a reference voltage. The reference voltage can be chosen so that it assists in synching the system so that the PLC can determine which input it is receiving data from. Specifically, measurement of the reference voltage is used to create a synchronizing signal between the multiple channel system and the PLC.

The clock of the multiple channel system can be configured to allow two (or more) measurements from each input. This helps make sure the correct value is sensed.

The multiple channel system can further comprise a second multiplexer circuit having a second plurality of inputs coupled to the binary counter circuit and voltage to frequency converter circuit. Additional multiplexer circuits can be added to further increase the number of inputs to the PLC.

The multiple channel system can further comprise a drop resister connected to each of the plurality of inputs. Alternatively, the multiple channel system can further comprise a pull up resister connected to each of the plurality of inputs.

In accordance with yet another embodiment of the invention, a system for providing data from multiple devices to a single input of a programmable logic controller is provided. The system comprises a first multiplexer having an output and a plurality of inputs. Each input is coupled to a voltage source. One of the voltage sources is a reference voltage. The system further includes a binary counter coupled to the first multiplexer for sequentially selecting one of the plurality of inputs. The system also includes a programmable logic controller having a first input coupled to the output of the first multiplexer for sequentially receiving data from the plurality of voltage sources coupled to the plurality of inputs of the first multiplexer. The system is designed so that selection of the reference voltage synchronizes the programmable logic controller and the multiplexer.

The system can further comprise a voltage to frequency converter coupled between the output of the first multiplexer and the input of the programmable logic controller. The voltage to frequency converter is configured such that the maximum voltage from an input of the multiplexer is matched to the maximum input speed of the input of the programmable logic controller.

Further aspects of the invention are disclosed in the Figures, and are described herein.

BRIEF DESCRIPTION OF THE DRAWINGS

To understand the present invention, it will now be described by way of example, with reference to the accompanying drawings in which.

DETAILED DESCRIPTION

Figure 1A:
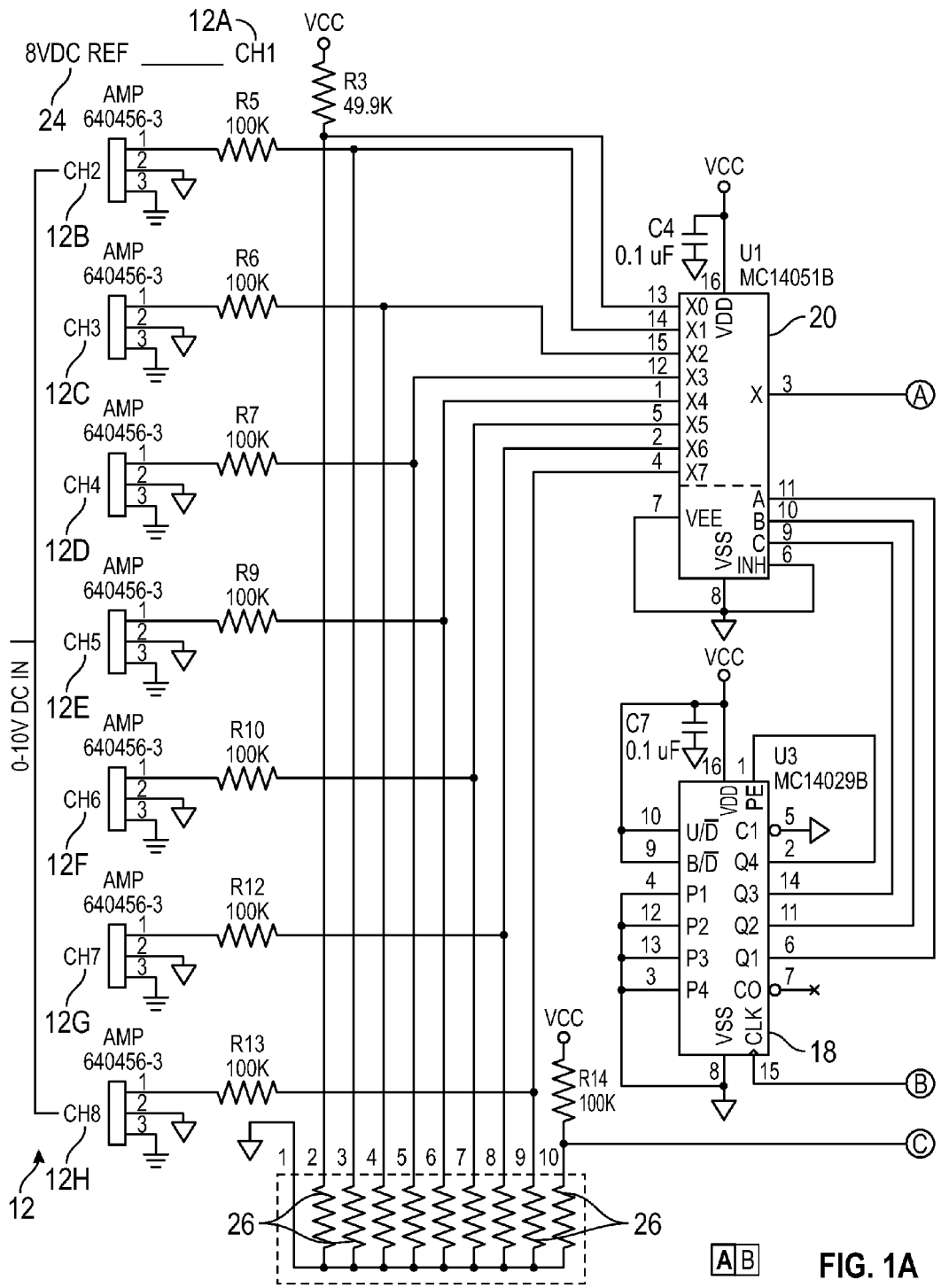
FIGS. 1A-B show a circuit diagram of an 8 channel input—single line output multiplexor (MUX) board for use with a PLC in accordance with one embodiment of the present invention.

While this invention is susceptible of embodiments in many different forms, there is shown in the drawings, and will herein be described in detail preferred embodiments of the invention with the understanding that the present disclosure is to be considered as an exemplification of the principles of the invention and is not intended to limit the broad aspect of the invention to the embodiments illustrated.

Figure 1B:
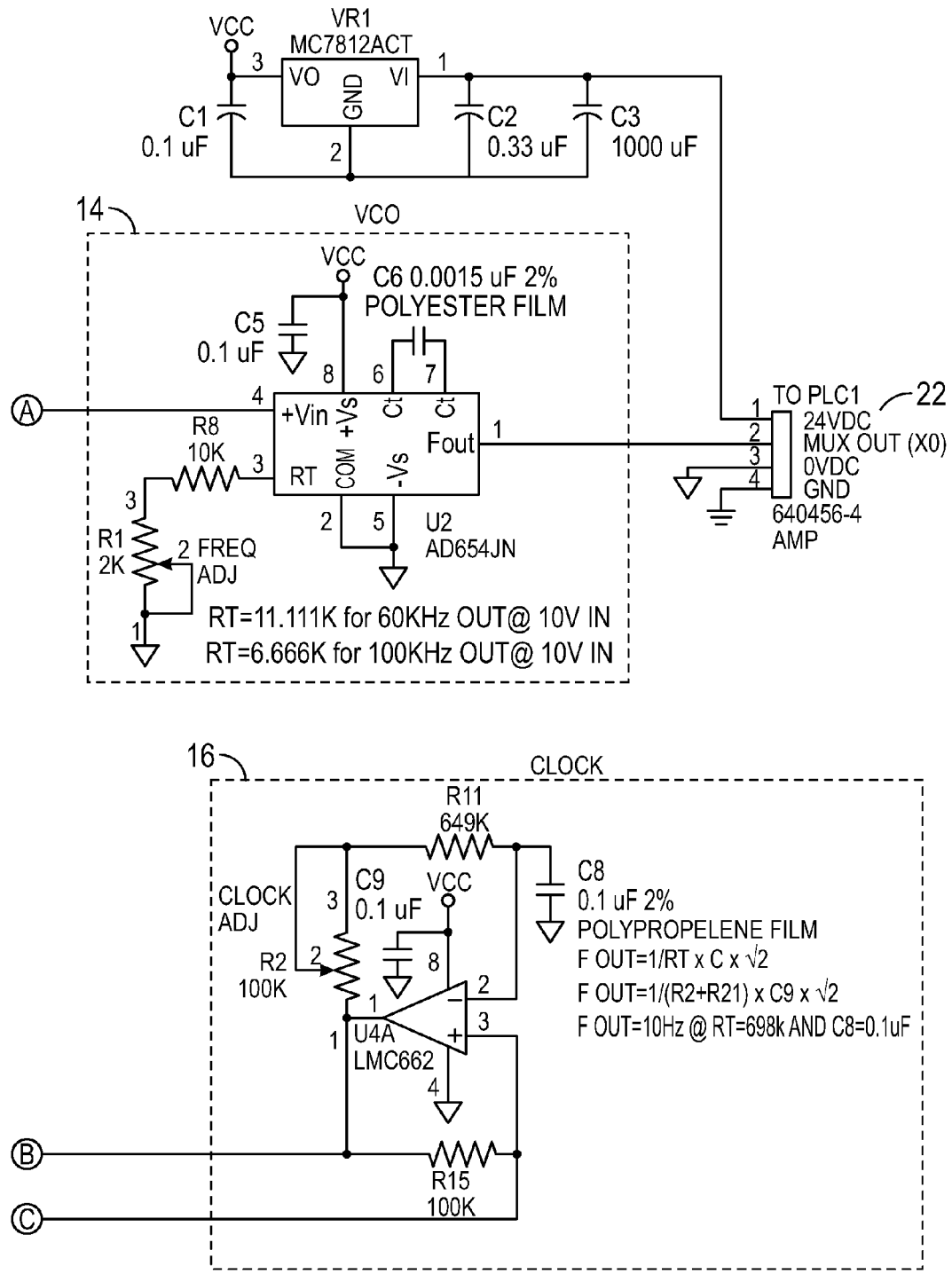

FIGS. 1A-B show a circuit diagram for an analog multiplexer (MUX) board 10 for use with a single input of a PLC (not shown). The analog multiplexer board 10 is a free-running scanner. It applies a set of 0-10 vdc analog inputs (or channels) 12 (represented individually as 12A-12H) sequentially to a voltage to frequency converter [VFC] 14 (such as a voltage-controlled oscillator—[VCO]) for a known period of time. This VFC 14 is configured such that the maximum input voltage [10 vdc] produces a frequency that is matched to the maximum input speed of the PLC input. The channels 12 are sequenced with a clock circuit 16 and a binary counter 18 coupled to a multiplexer chip 20. The board 10 connects to the input of the PLC through an output 22.

A PLC program (running on the PLC) uses a speed measurement function on a connected high speed input (connected to the output 22) to count the pulses from the multiplexer board 10 for a given period of time, the duration being set such that at the maximum input speed a full count would be (in this example) 2000, which would correspond to a 10 vdc input at the VFC. This speed function runs constantly, restarting after each measurement.

The clock 16 of the multiplexer board 10 is set for a period that allows just over two full speed measurements at the PLC before clocking to the next channel 12. This is to ensure that a full measurement of the applied channel 12 is made.

A first input channel 12A on the multiplexer board is strapped to an 8 vdc reference voltage 24. The remaining channels 12B-H are divided in half so that a 10 vdc input equates to 5 vdc at the VFC 14 and a count of 1000 at the PLC. The only time the PLC will measure a count greater than 1000 is when it is applied to the first channel 12A, which will produce a measurement of 1600 at the PLC. By using a "greater than" line command to control a bit in the PLC program, this measurement serves as the synchronizing signal between the multiplexer board 10 and the PLC program, resetting the channel count to zero each time the reference voltage is measured. Since the clock period and number of inputs of the multiplexer board 10 is known, the PLC is programmed to independently increment the channel count at the same rate as the multiplexer board 10. Since the elapsed time of the first channel measurement is also monitored, it is deducted from the remaining dwell time. This compensates for the delay between the application of the first channel 12A and the production of the synchronizing bit.

Since the channel count of the multiplexer board 10 and PLC program are now synchronized, the PLC can sort out the measurements according to channel 12. Using a decode function and the current channel count, an array of sequential control bits are produced representing the number of analog input channels. Each bit controls a timer programmed for just over twice the duration of the speed function, but just under the duration of the channel dwell time. The timer controls a move function that transfers the measurement to a data register in the PLC which represents the corresponding channel number. This guarantees that only one, full on-channel measurement is transferred to the data register before the multiplexer board 10 applies the next channel. When the multiplexer board 10 completes a full scan it resets to the first channel 12A, which applies the reference voltage once again, and the PLC resets the channel count to "0" [channel 1]. As shown, each of the input channels 12 is connected to a drop resistor 26.

By varying the clock speed on the multiplexer board 10 in conjunction with the time delays in the PLC logic, the refresh speed/resolution of each channel can be adjusted. As the scan rate increases, resolution decreases and vice versa. By resetting the VCO frequency output with @ 10 vdc in, the multiplexer board 10 can be "tuned" to the input speed of the connected PLC.

Figure 2A:
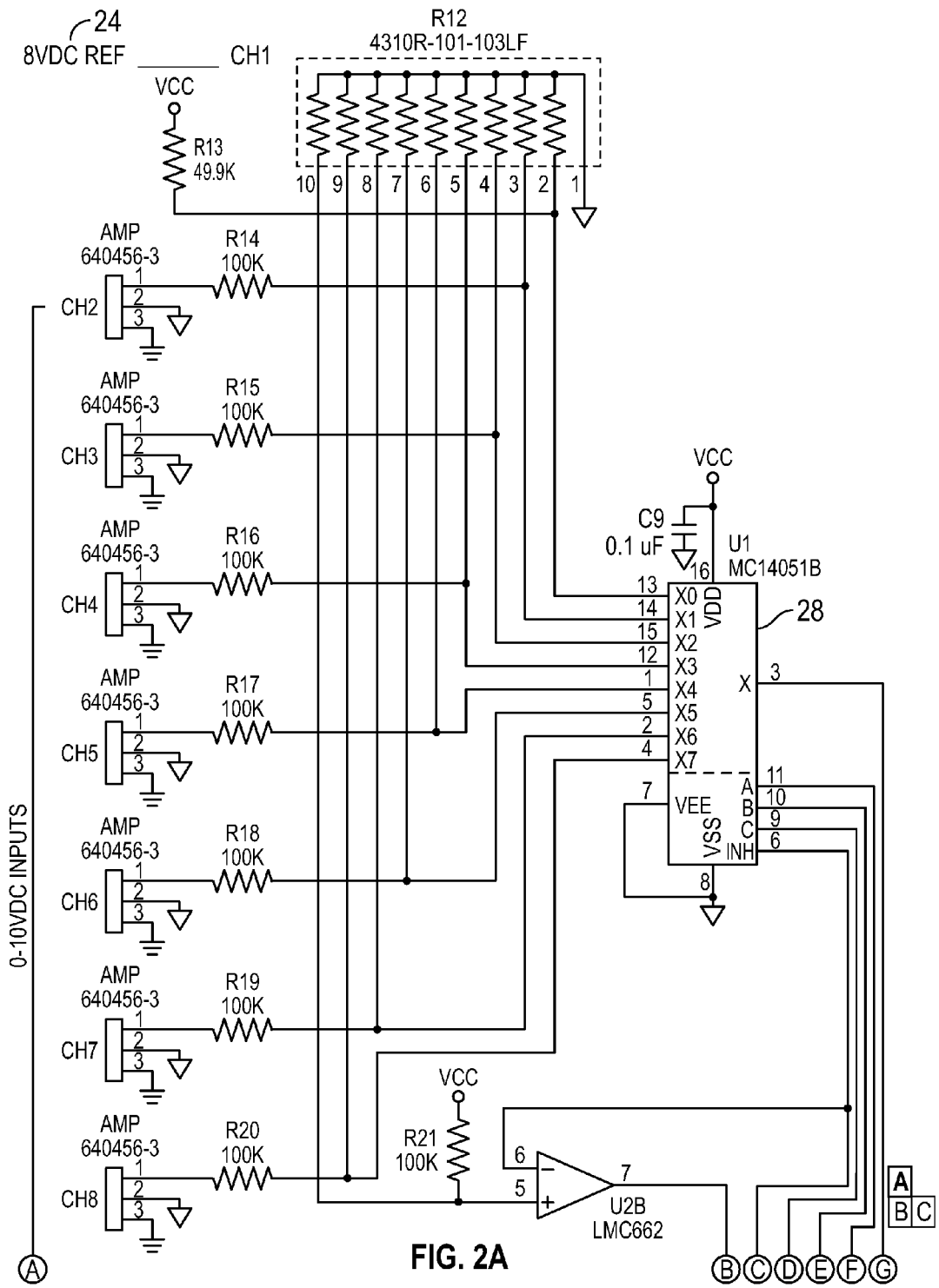
FIGS. 2A-C show a circuit diagram of a 16 channel input—single line output multiplexor (MUX) board for use with a PLC in accordance with one embodiment of the present invention.
Figure 2B:
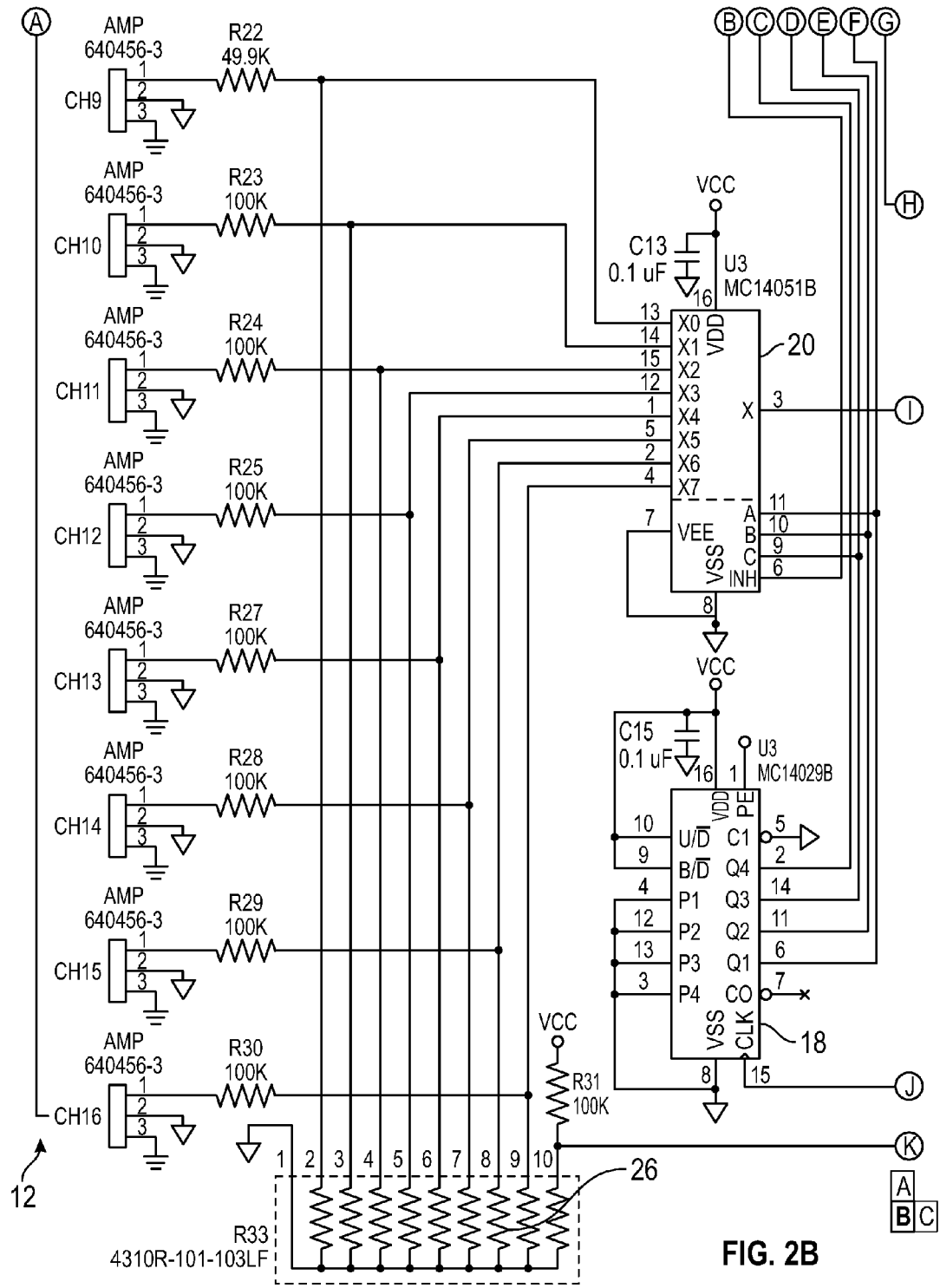
Figure 2C:
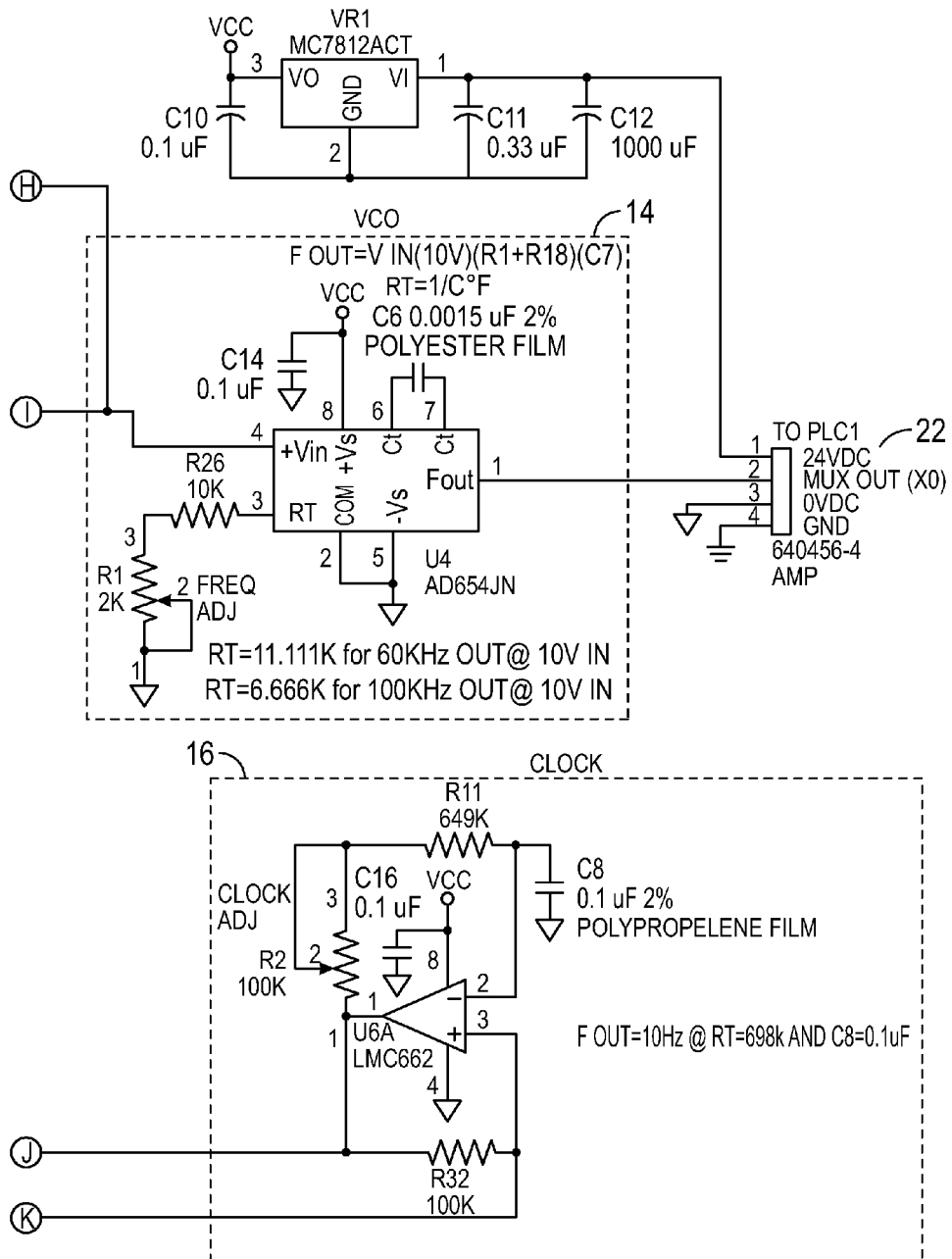
Figure 3A:
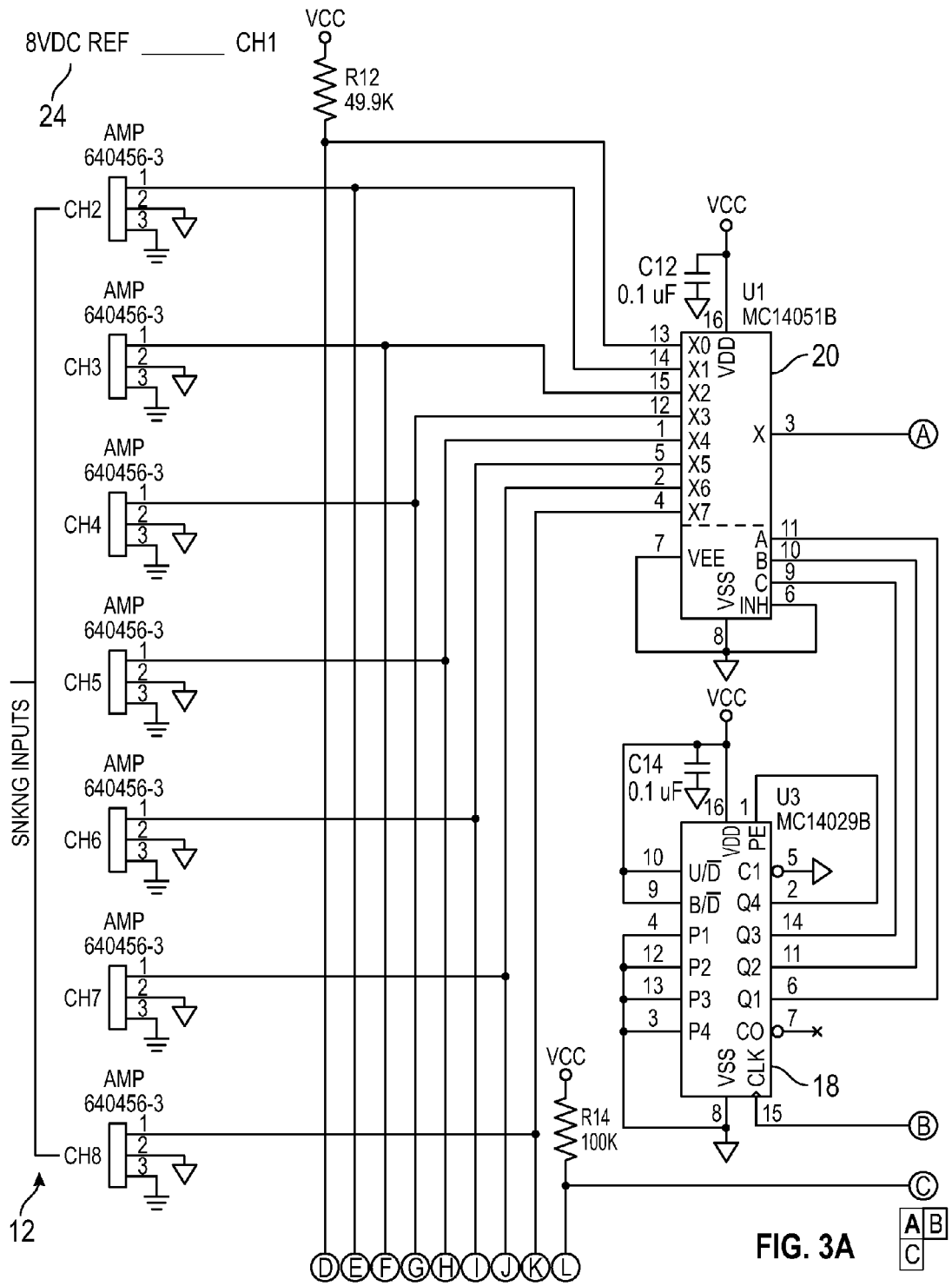
FIGS. 3A-C show a circuit diagram of an 8 channel input—single line output analog/digital multiplexor (MUX) board for use with a PLC in accordance with one embodiment of the present invention.
Figure 3B:
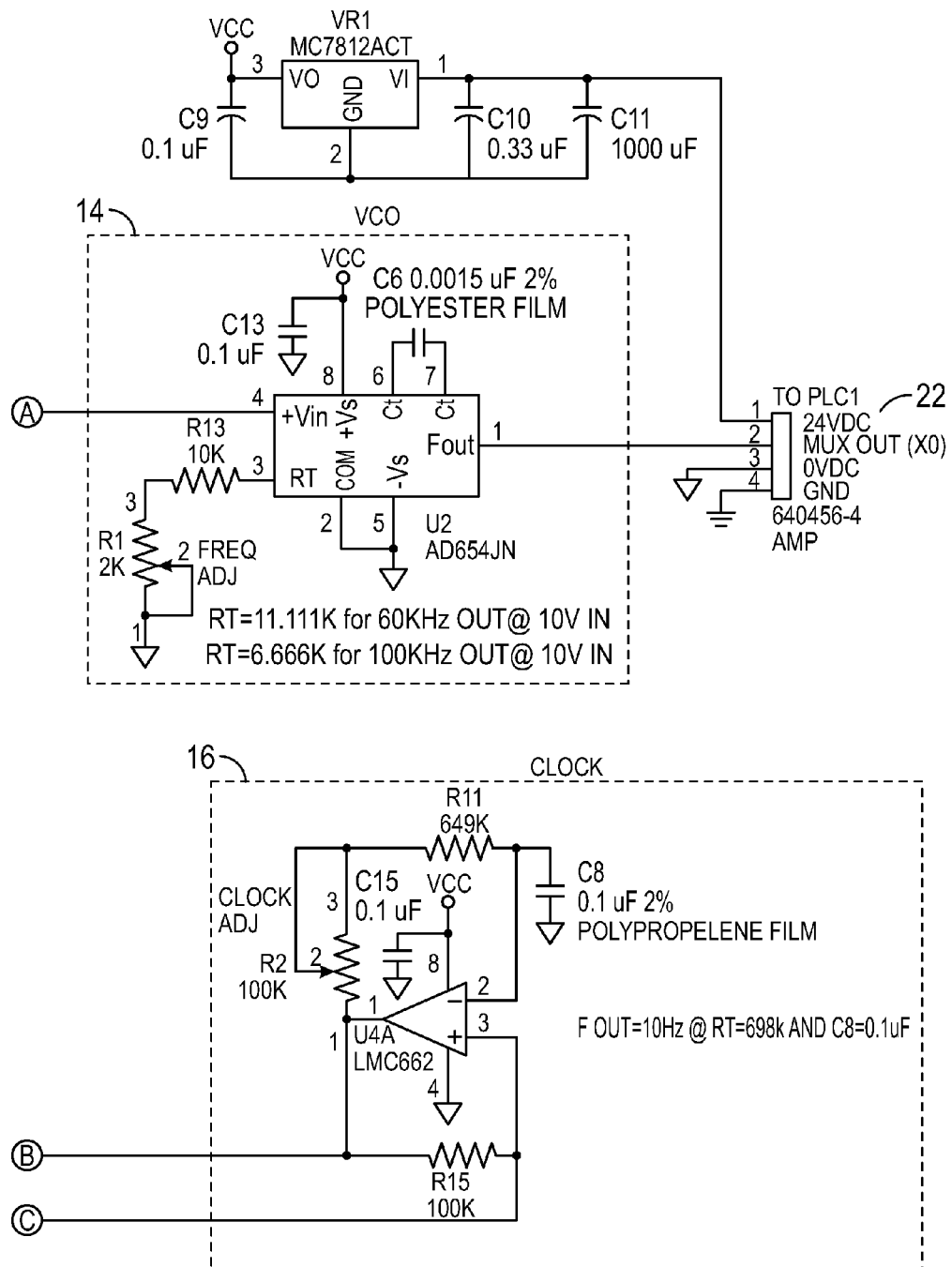
Figure 3C:
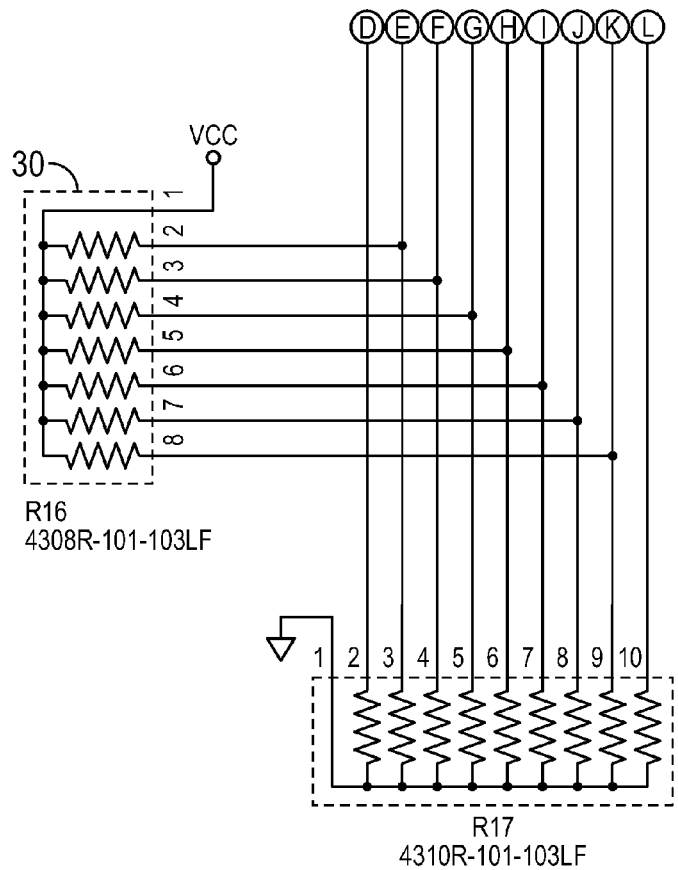
Figure 4A:
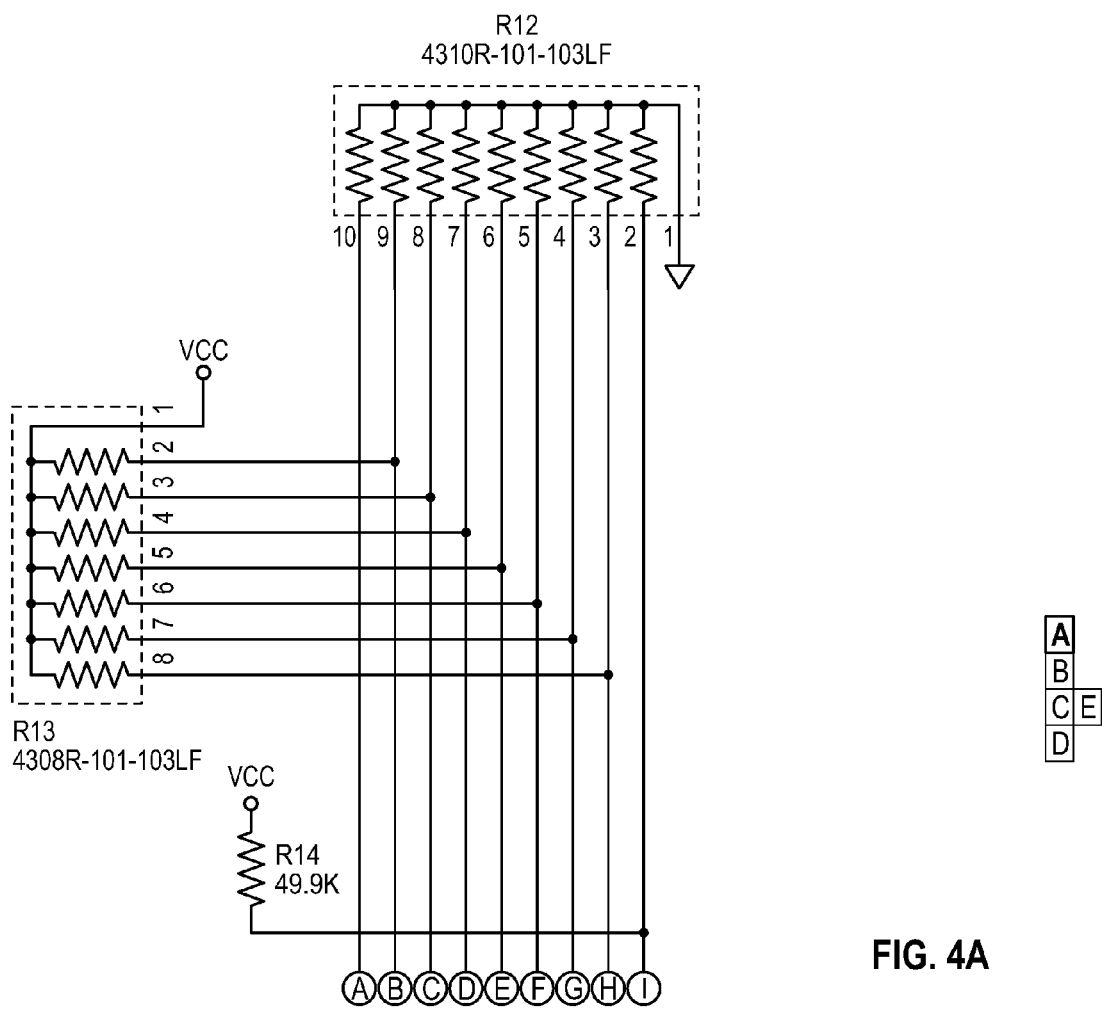
FIGS. 4A-E show a circuit diagram of a 16 channel input—single line output analog/digital multiplexor (MUX) board for use with a PLC in accordance with one embodiment of the present invention; and, FIG. 5 is a timing chart exemplifying timing aspects of a system and method in accordance with the present invention.
Figure 4B:
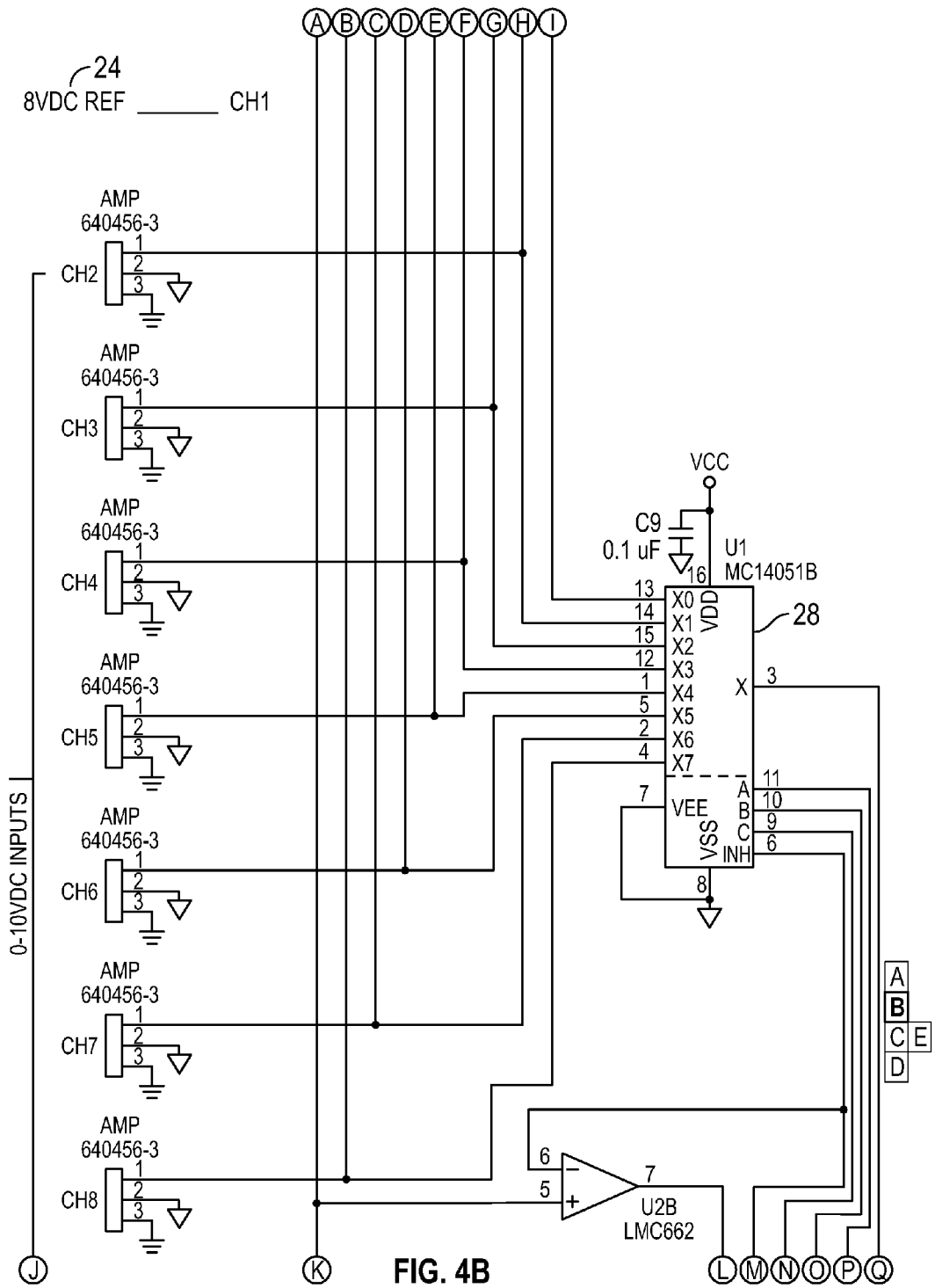
Figure 4C:
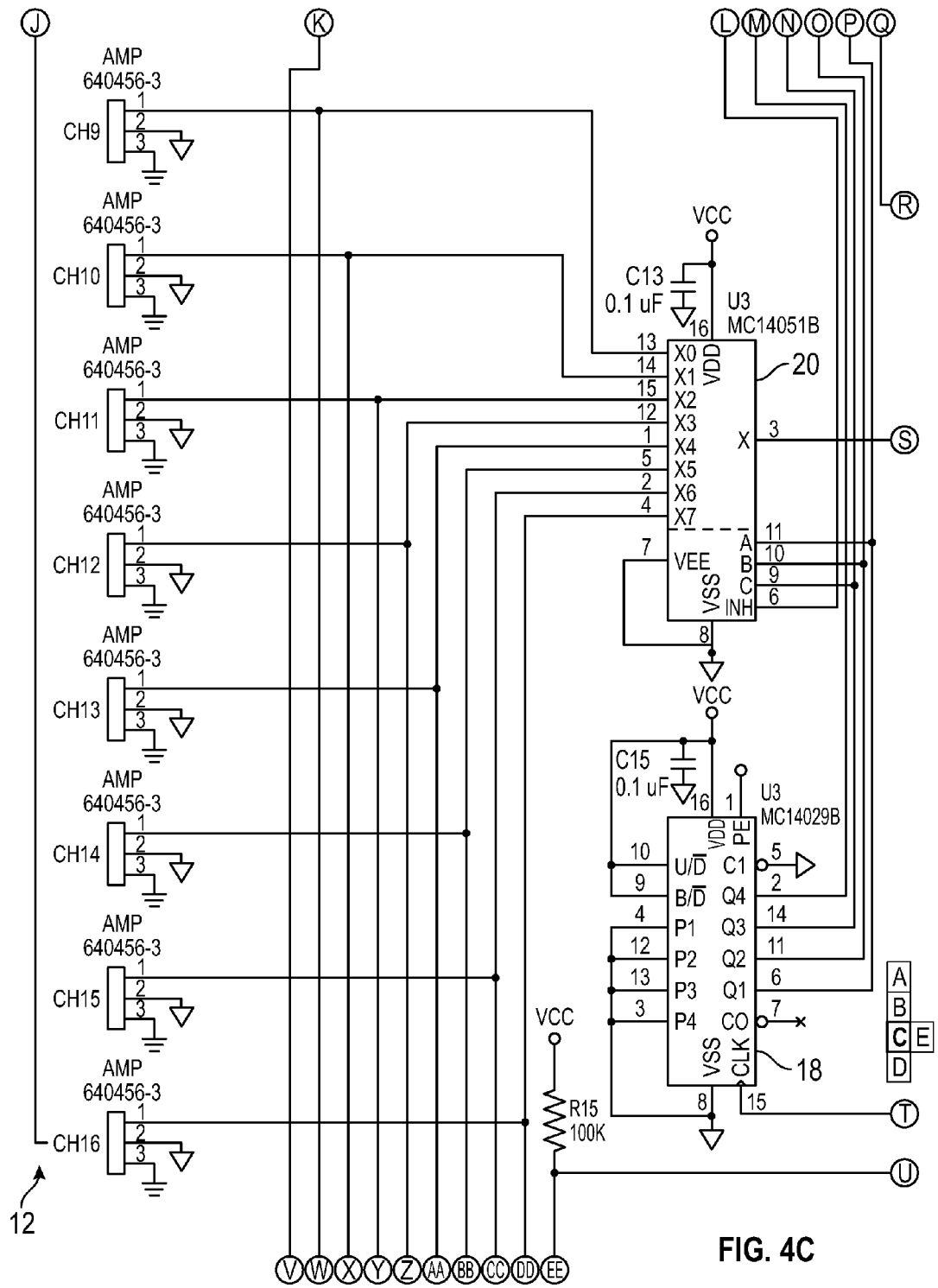
Figure 4D:
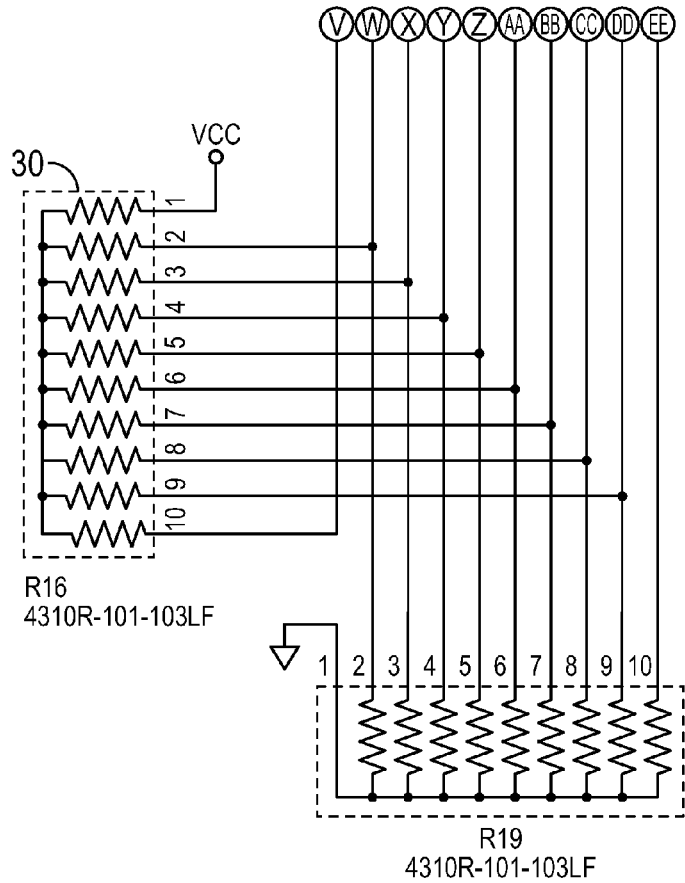
Figure 4E:
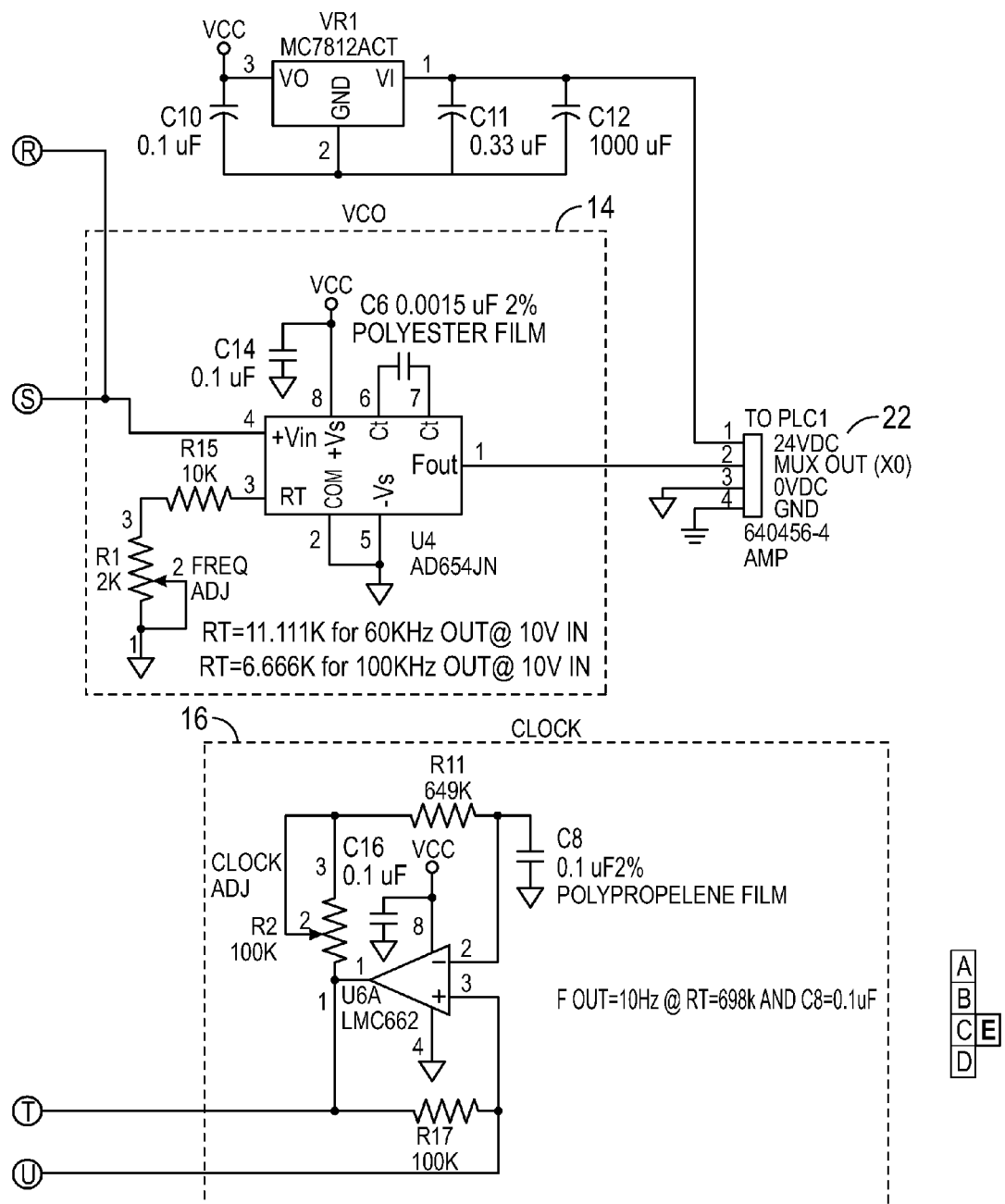

As shown in FIGS. 2A-C, the input capacity can be expanded by eight additional channels with the addition of a second analog multiplexer chip 28. In a similar manner, the input capacity can be further expanded by adding additional multiplexer chips to the board.

As illustrated in FIGS. 3A-C and 4A-E, by replacing the dropping resistors 26 on each input channel 12 with pull-up resistors 30 of the same value the circuit on the multiplexer board 10 becomes a digital input expander. Each channel 12 would be at 6 vdc until a sinking input is applied, changing it to 0 vdc. By using a "greater than" line command in the PLC logic, a bit can be controlled on and off. In this application resolution should be set to a minimum and multiplexer clock speed to a maximum for fastest response.

The voltages applied to the input channels can be provided by a variety of devices. The PLC can utilize the inputted data for any typical control or monitoring operation.

Figure 5:
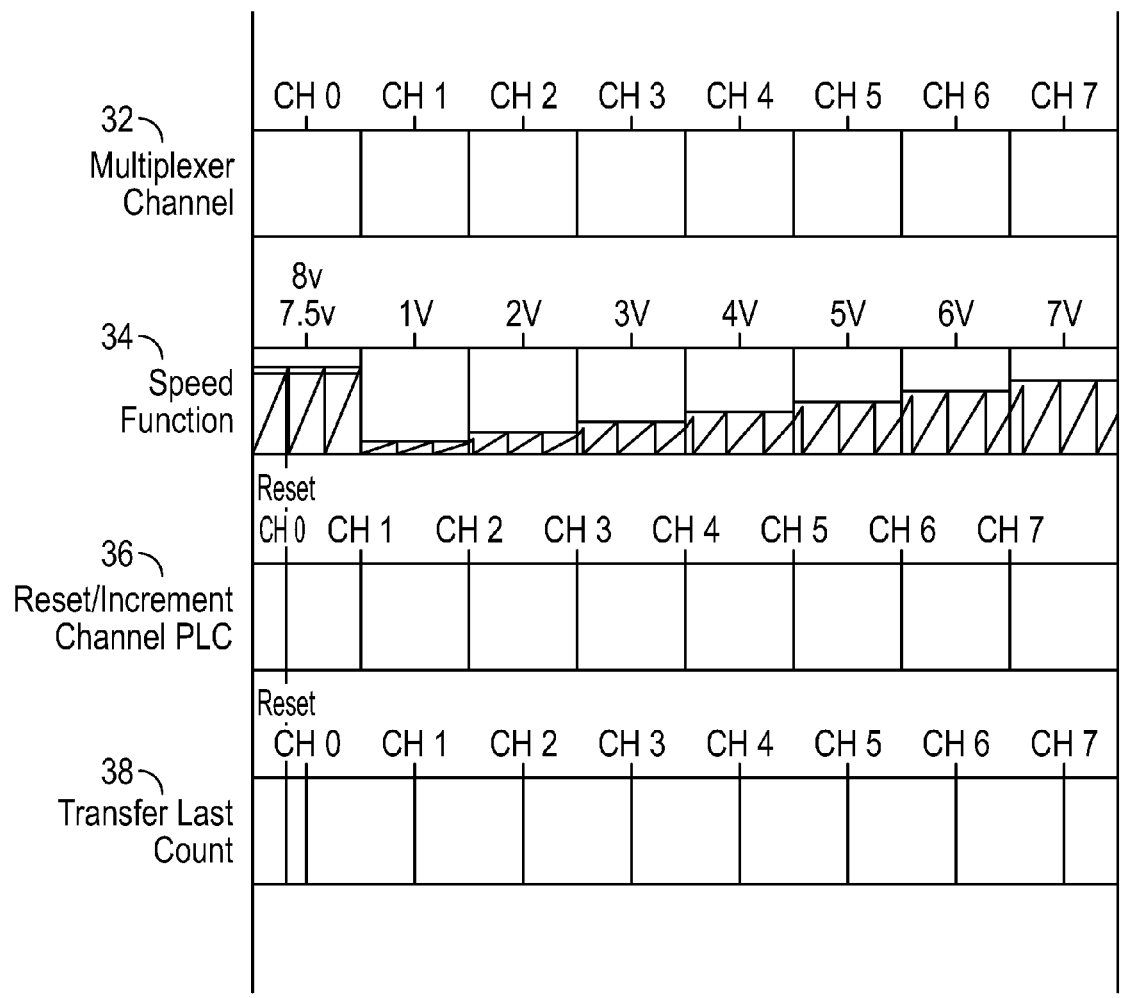

FIG. 5 provides exemplary timing charts illustrating certain aspects of the present system and method. The top of the chart shows the timing of the multiplexer channels 32 (e.g., stepping through channels 0-7). A speed function chart 34 shows a reset value for channel 0, and exemplary increasing sensed values for the other channels (where each sawtooth represents a cycle). The largest value is always the reset value. Below the speed function 34, a reset/increment channel PLC chart 36 is provided showing the timing for the PLC (which matches the multiplexer channel timing). Below the PLC timing is a transfer last count chart 38 which provides an indication as to when data received for a channel is transferred to a register in the PLC. As shown, the transfer for a channel occurs prior to the multiplexer or PLC switching to the next channel.

Many modifications and variations of the present invention are possible in light of the above teachings. It is, therefore, to be understood within the scope of the appended claims the invention may be protected otherwise than as specifically described.

I claim:

1. A multiple channel system for a single input of a controller comprising:
   a first multiplexer having a plurality of inputs and an output;
   a binary counter circuit coupled to the first multiplexer; and,
   a controller having a first input coupled to the output of the first multiplexer, the first input selectively receiving data from the plurality of inputs to the first multiplexer, wherein each input of the first plurality of inputs of the first multiplexer is coupled to a device providing an analog voltage signal.

2. The system of claim 1 wherein the controller is a PLC.

3. The system of claim 1 further comprising a clock coupled to the binary counter circuit.

4. The system of claim 1 further comprising a voltage to frequency converter coupled to the multiplexer.

5. The system of claim 4 wherein one of the plurality of inputs of the first multiplexer is coupled to a reference voltage to synchronize the system.

6. The system of claim 1 further comprising a second multiplexer having a plurality of inputs and an output, the output of the second multiplexer coupled to the first input of the controller, the first input selectively receiving data from the plurality of inputs to the second multiplexer.

7. The system of claim 6 wherein the binary counter is coupled to the second multiplexer.

8. The system of claim 7 wherein each of the plurality of inputs of the second multiplexer is coupled to an analog voltage device.

9. The system of claim 1 further comprising circuitry for passing digital data to the controller.

10. The system of claim 9 wherein the circuitry for passing digital data to the controller includes a plurality of pull up resisters, each pull-up resister coupled to one of the plurality of inputs to the first multiplexer.

11. A multiple channel system for a single input of a PLC comprising:
    a first multiplexer circuit having a first plurality of analog inputs;
    a voltage to frequency converter circuit coupled to the multiplexer circuit wherein the voltage to frequency converter circuit is configured so that the maximum input voltage applied to the multiplexer circuit produces a frequency that is matched to the maximum input speed of the single input of the PLC;
    a binary counter circuit coupled to the multiplexer circuit;
    a clock circuit coupled to the binary counter circuit wherein the clock circuit and the binary counter are configured to sequence the multiplexer circuit through the plurality of inputs; and,
    a single output coupled to the voltage to frequency converter circuit for connection to a single input of the PLC.

12. The multiple channel system of claim 11 wherein one of the plurality of analog inputs of the multiplexer circuit is connected to a reference voltage to synchronize the system.

13. The multiple channel system of claim 12 wherein measurement of the reference voltage is used to create a synchronizing signal between the multiple channel system and the PLC.

14. The multiple channel system of claim 11 wherein the clock is configured to allow two measurements from each input.

15. The multiple channel system of claim 11 further comprising a second multiplexer circuit having a second plurality of inputs coupled to the binary counter circuit and voltage to frequency converter circuit.

16. The multiple channel system of claim 11 further comprising a drop resister connected to each of the plurality of inputs.

17. The multiple channel system of claim 11 further comprising a pull up resister connected to each of the plurality of analog inputs.

18. A system for providing data from multiple devices to a single input of a programmable logic controller comprising:
    a first multiplexer having an output and a plurality of inputs, each input coupled to a voltage source wherein one voltage source is a reference voltage;
    a binary counter coupled to the first multiplexer for sequentially selecting one of the plurality of inputs;
    a programmable logic controller having a first input coupled to the output of the first multiplexer for sequentially receiving data from each voltage source coupled to the plurality of inputs of the first multiplexer wherein selection of the reference voltage synchronizes the programmable logic controller and the multiplexer; and,
    a voltage to frequency converter coupled between the output of the first multiplexer and the input of the programmable logic controller, the voltage to frequency converter configured such that the maximum voltage from an input of the multiplexer is matched to the maximum input speed of the input of the programmable logic controller.

19. A multiple channel system for a single input of a controller comprising:
    a first multiplexer having a plurality of inputs and an output;
    a binary counter circuit coupled to the first multiplexer;
    a controller having a first input coupled to the output of the first multiplexer, the first input selectively receiving data from the plurality of inputs to the first multiplexer; and,
    a second multiplexer having a plurality of inputs and an output, the output of the second multiplexer coupled to the first input of the controller, the first input selectively receiving data from the plurality of inputs to the second multiplexer.

20. A multiple channel system for a single input of a controller comprising:
    a first multiplexer having a plurality of inputs and an output;
    a binary counter circuit coupled to the first multiplexer;

a controller having a first input coupled to the output of the first multiplexer, the first input selectively receiving data from the plurality of inputs to the first multiplexer; and,
circuitry for passing digital data to the controller.

* * * * *